(12) United States Patent
Graybeal

(10) Patent No.: US 10,179,728 B2
(45) Date of Patent: Jan. 15, 2019

(54) MICRO-BOLOMETER HAVING AN ADJUSTABLE DYNAMIC RANGE

(71) Applicant: EMX, INTERNATIONAL LLC, Melbourne, FL (US)

(72) Inventor: Daniel Graybeal, Melbourne, FL (US)

(73) Assignee: EMX Advanced Technologies, LLC, Melbourne, FL (US)

( * ) Notice: Subject to any disclaimer, the term of this patent is extended or adjusted under 35 U.S.C. 154(b) by 38 days.

(21) Appl. No.: 15/324,892

(22) PCT Filed: Jul. 9, 2015

(86) PCT No.: PCT/US2015/039815
§ 371 (c)(1),
(2) Date: Jan. 9, 2017

(87) PCT Pub. No.: WO2016/007791
PCT Pub. Date: Jan. 14, 2016

(65) Prior Publication Data
US 2017/0203955 A1    Jul. 20, 2017

Related U.S. Application Data

(60) Provisional application No. 62/022,492, filed on Jul. 9, 2014, provisional application No. 62/022,509, filed on Jul. 9, 2014.

(51) Int. Cl.
*B81B 3/00* (2006.01)
*G01J 5/40* (2006.01)

(52) U.S. Cl.
CPC .............. *B81B 3/0024* (2013.01); *G01J 5/40* (2013.01)

(58) Field of Classification Search
CPC .............. G01J 5/40; G01J 5/44; B81B 3/2002
See application file for complete search history.

(56) References Cited

U.S. PATENT DOCUMENTS

| 6,420,706 | B1 * | 7/2002 | Lurie | G01J 5/20 |
| | | | | 250/338.1 |
| 2005/0236935 | A1 * | 10/2005 | Ohmori | H01H 57/00 |
| | | | | 310/328 |
| 2009/0026892 | A1 * | 1/2009 | Nakamura | H01L 41/094 |
| | | | | 310/367 |

(Continued)

*Primary Examiner* — Michael C Bryant
(74) *Attorney, Agent, or Firm* — Myers Wolin, LLC

(57) ABSTRACT

In some aspects, the present invention embodies both the method and apparatus for converting a pattern of irradiation to a visible image. An embodiment of the present invention provides an array of micro-electro-mechanical sensors with each sensor includes a deflectable micro-cantilever, responsive to absorbed incident radiation and to an applied repulsive electrostatic field. Associated circuitry senses a change in an output signal of the sensor as it responds to incident radiation incident upon the cantilever and provides a biasing force to deflect the cantilever and maintain the detector output signal at a desirable level. The biasing element may be a piezoelectric element, a heater or a pair of electrodes and the corresponding biasing stimulus may be stress (expansion), heat, or electrostatic change. The stimulus compensates for the effect of the infrared radiation and maintains the chosen detector output level at the same level.

18 Claims, 4 Drawing Sheets

(56) References Cited

U.S. PATENT DOCUMENTS

| | | | |
|---|---|---|---|
| 2011/0089324 A1* | 4/2011 | Edwards | G01J 5/40 250/332 |
| 2012/0037805 A1* | 2/2012 | Dupont | G01J 5/22 250/349 |
| 2013/0037395 A1* | 2/2013 | Hori | H01L 41/042 200/181 |
| 2017/0203955 A1* | 7/2017 | Graybeal | B81B 3/0024 |

* cited by examiner

MICRO-BOLOMETER HAVING AN ADJUSTABLE DYNAMIC RANGE

CROSS REFERENCE TO RELATED APPLICATIONS

This application is a Non-Provisional Application of U.S. Provisional Patent Application 62/022,509 and U.S. Provisional Patent Application 62/022,492, filed Jul. 9, 2014; which are incorporated herein by reference.

TECHNICAL FIELD

This invention relates to radiant energy imaging sensors, and, in particular to such methods, systems, apparatus and devices for sensors as employ a micro-cantilever as a responsive element.

BACKGROUND ART

Various optical detectors such as infrared radiation detectors are available in today's electronics industry. Many techniques for converting infrared radiation to visible images are also known. One such example of an infrared imager available in today's art includes a deflectable microelectromechanical (MEM) cantilever device formed of a bi-material on a semiconductor substrate. The bi-material portion of the micro-cantilever device is formed of two different materials sharing a contiguous surface, and having mismatched thermal coefficients of expansion (TCE). Examples of such bi-material MEM micro-cantilever devices and methods for forming the same, are as disclosed in U.S. Pat. No. 5,844,238 issued to Sauer et al. and U.S. Pat. Nos. 6,140,646 and 6,420,706, issued to Lurie et al.

The bi-material MEM micro-cantilever devices presently available in the art, bend, or deflect, when infrared radiation is absorbed upon an absorber element of the micro-cantilever heating the bi-material section of the micro-cantilever, thereby urging one of the bi-materials to expand at a greater rate than the other bi-material, thereby causing the micro-cantilever to deflect, or bend. The terms bend and deflect may be used interchangeably hereinafter.

When infrared radiation is incident upon such a micro-cantilever being used as an optical detector, it is desired to produce a visible image having an intensity which varies directly with the intensity of the incident infrared radiation. As a micro-cantilever device bends in response to such incident infrared radiation, it approaches a physical limitation to its degree of bending. For example, if a micro-cantilever device is fabricated so as to bend downward in response to incident infrared radiation, the physical limitation is reached when the micro-cantilever touches the substrate over which it is formed. For a micro-cantilever device chosen to bend upward in response to incident infrared radiation, this, too, will reach a physical limitation point past which it can no longer bend. As such, when this point of the physical limitation of bending is approached, the micro-cantilever device is more resistant to bending and therefore, less responsive to additional infrared radiation. An increased amount of incident infrared radiation will not cause the same extent of bending as when the micro-cantilever is in the rest position. While a significantly higher dose of infrared radiation may force the micro-cantilever to bend slightly more towards its physical limitation, the degree of this bending will not be proportional, so the device will not be linear in this region. Thus, the linear range of the device is limited.

Moreover, after the physical limitation point is reached, additional incident infrared radiation will simply not cause any further bending. This limits the dynamic range of the device. Since the intensity of an optical image ultimately produced from such a device, is based on the degree of bending, it can be seen that such a device having a poor dynamic range and limited linearity, produces an image having the same shortcomings.

Various methods for sensing the degree of bending are available in the art. Examples of such methods include optically measuring the distance between the micro-cantilever and the substrate, and electrically measuring the capacitance of a capacitor which includes an electrode formed in the substrate and another electrode formed in the micro-cantilever above the substrate. Various methods for producing a visible image having an intensity based upon the extent of bending are also known.

SUMMARY OF THE INVENTION

In one embodiment the inventive detector includes a deflectable bi-material micro-cantilever. The micro-cantilever is deflectable in response to either of an incident of infrared radiation and/or a further mechanical stimulus. The cantilever has a neutral reference position relative to the substrate when not exposed to either infrared radiation or the mechanical stimulus.

A biasing mechanism applies the mechanical stimulus to the micro-cantilever. The biasing mechanism includes a first and second conductive element with a piezoelectric element disposed there between. A contact tip disposed adjacent one end of the micro-cantilever is in electrical communication with a power source. A contact plate is positioned on the substrate beneath the contact tip with a predetermined space there between with the micro-cantilever is in the reference position. The space between the contact plate and the contact tip is defined by a spacer between the micro-cantilever and the substrate when the cantilever is in the neutral position.

The piezoelectric element of the biasing mechanism expands when a current is applied to at least one of the first and second conductive elements. The expansion causes deflection of the micro-cantilever such that the contact tip comes into contact with the contact plate thereby closing a circuit.

In another embodiment the inventive detector also includes a deflectable bi-material micro-cantilever. The micro-cantilever is deflectable in response to either of an incident of infrared radiation and/or a further mechanical stimulus. The cantilever has a neutral reference position relative to the substrate when not exposed to either infrared radiation or the mechanical stimulus.

A first biasing mechanism applies a first mechanical stimulus to the micro-cantilever. The biasing mechanism includes a first and second conductive element with a piezoelectric element disposed there between. A contact tip disposed adjacent one end of the micro-cantilever is in electrical communication with a power source. A contact plate is positioned on the substrate beneath the contact tip with a predetermined space there between with the micro-cantilever is in the reference position. The space between the contact plate and the contact tip is defined by a spacer between the micro-cantilever and the substrate when the cantilever is in the neutral position.

The piezoelectric element of the biasing mechanism expands when a current is applied to at least one of the first and second conductive elements of the first biasing mechanism. The expansion causes deflection of the micro-cantilever such that the contact tip comes into contact with the contact plate thereby closing a circuit.

A second biasing mechanism applies a second mechanical stimulus to the micro-cantilever. The second biasing mechanism includes a first and second conductive element with a piezoelectric element disposed there between.

The piezoelectric element of the second biasing mechanism expands when a current is applied to at least one of the first and second conductive elements of the second biasing mechanism. The expansion causes upward deflection of the micro-cantilever such that the contact tip loses contact with the contact plate thereby opening the circuit.

BRIEF DESCRIPTION OF THE DRAWINGS

For a fuller understanding of the invention, reference should be made to the following detailed description, taken in connection with the accompanying drawings, in which.

BEST MODE FOR CARRYING OUT THE INVENTION

Figure 1:
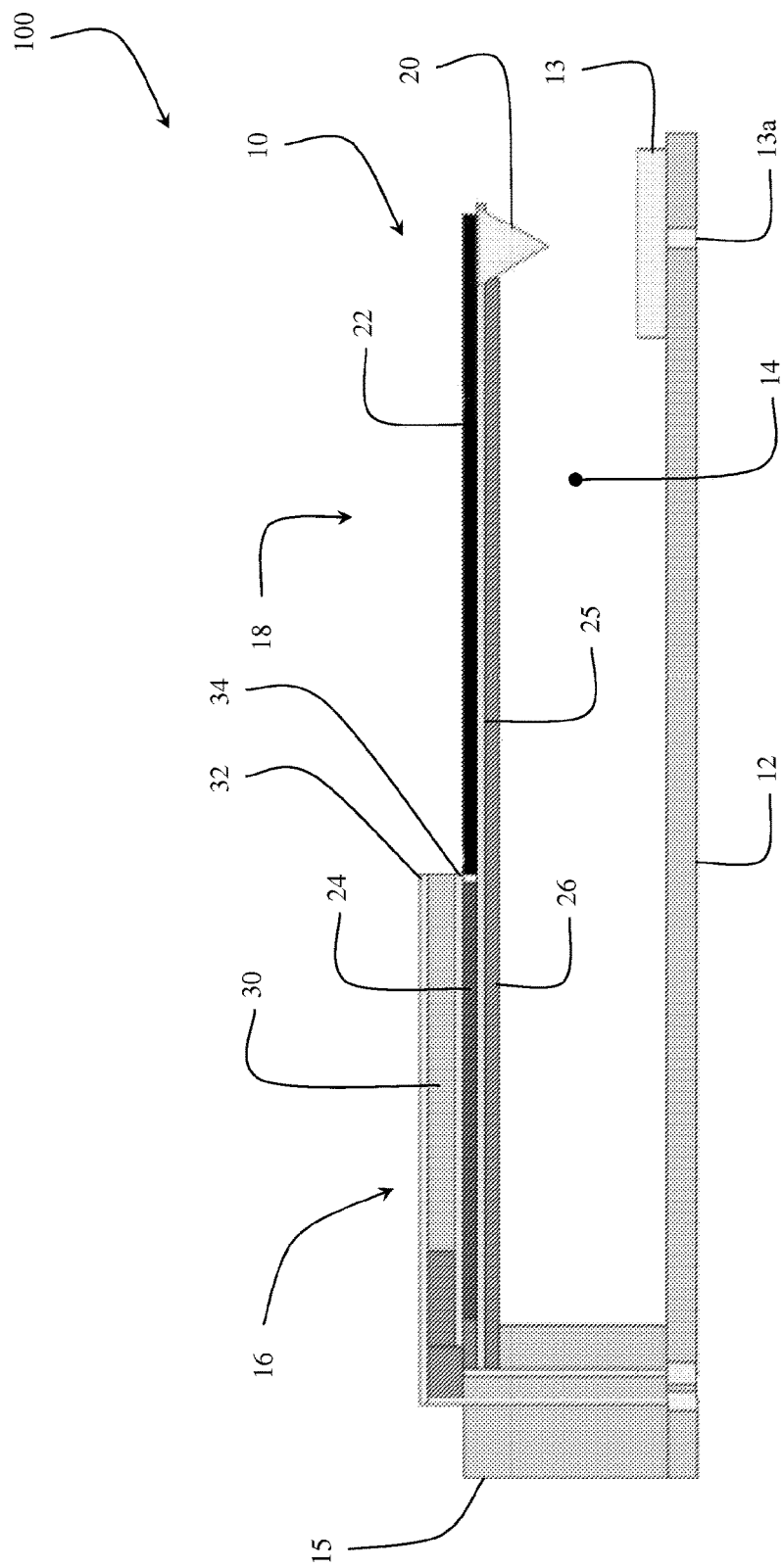
FIG. 1 is a cross sectional view showing an illustrative embodiment of inventive detector.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The following is a list of the reference numbers used in the drawings and the detailed specification to identify components:

| | |
|---|---|
| Detector | 100 |
| Biomorph arm | 10 |
| Substrate | 12 |
| Contact plate | 13 |
| Contact plate lead | 13a |
| Gap | 14 |
| Spacer | 15 |
| 1$^{st}$ spacer conductor | 15a |
| 2$^{nd}$ spacer conductor | 15b |
| 3$^{rd}$ spacer conductor | 15c |
| Bi-material Region | 16 |
| Absorption Region | 18 |
| Contact Tip | 20 |
| Absorber | 22 |
| 1st bimorph material | 24 |
| Arm conductor | 25 |
| 2$^{nd}$ bimorph material | 26 |
| Biasing plate | 30 |
| Upper conductive element | 32 |
| Lower conductive element | 34 |
| 2$^{nd}$ biasing plate | 40 |
| Upper conductive element | 42 |
| Lower conductive element | 44 |
| Power source | 50 |
| Voltage generator | 55 |
| Digital clock counter | 60 |
| Digital Register | 65 |
| Time Register Circuit | 70 |
| Voltage Register Circuit | 75 |

In some aspects, the present invention embodies both the method and apparatus for converting a pattern of irradiation to a visible image. A preferred embodiment of the present invention provides an array of micro-electro-mechanical sensors formed on a substrate. Each sensor includes a deflectable micro-cantilever formed of an irradiance absorber plate supported by a bi-material element. The deflectable micro-cantilever is suspended above the substrate and bends toward the surface plate in response to absorbed incident radiation which increases its temperature. The deflectable micro-cantilever, according to another embodiment, also bends away from the surface plate in response to an applied upward bias from biasing plate underlying the micro-cantilever.

FIG. 1 is a cross sectional view showing an illustrative embodiment of inventive detector 100. As shown, detector 100 includes biomorph arm 10 suspended over substrate 12. Gap 14 forms the opening between substrate 12 and biomorph arm 10 and is defined by the height of spacer 15. Substrate 12 includes contact plate 13 and contact plate lead 13a.

Biomorph arm 10 includes bi-material region 16 and absorbing region 18. Within absorbing region 18, absorber material 22 absorbs radiation which is incident on biomorph arm 10. In bi-material region 16, first bi-material film 24 and second bi-material 26 are present. First bi-material film 24 and absorber material 22 are contiguous and disposed in overlying relation to second bi-material film 26.

Contact tip 20 is adjacent the end of biomorph arm 10. Tip 20 and is preferably contiguous with second biomorph material 26 and in underlying relation to first biomorph material 24. Arm conductor 25 provides electrical communication between tip 20 and the conductive elements of spacer 15 (discussed below). Arm conductor 25 is preferably disposed in overlying relation to second bimorph material 26 and underlying relation to first bimorph material 24 and absorber material 22. Contact plate 13 and contact plate lead 13a electrically couple the device to other circuitry and devices (discussed below) when an electrical circuit is closed by the contact of tip 20 with plate 13.

First bi-material material 24 and second bi-material material 26 have different coefficients of thermal expansion. When radiation is incident upon the MEM structure, biomorph arm 10 is heated and bends because the two bi-material expand 24 and 26 expand at different rates. FIG. 1 shows biomorph arm 10 in a neutral position when the device is not exposed to radiation. The bi-materials are made of materials chosen to have a maximal differential coefficient of thermal expansion (CTE). The principles of operation of bi-material micro-cantilever devices are well known to those skilled in the sensor art. In the past, silicon carbide or silicon nitride has been used for the low-CTE layer, and gold or aluminum for the high-CTE layer. In a preferred embodiment silicon dioxide is used for its low CTE, approaching zero, and zinc is used for its high CTE. Though selenium and plutonium each have higher CTEs, their use in industrial processes is problematic. Polymers may be used for their very high CTEs, but have limited mechanical strength, particularly in the very thin films required for high bi-material element sensitivity.

In addition to differential thermal expansion, another parameter determining the responsivity (microns of plate deflection per degree C.) of the bi-material is its thickness, or the separation between the center, or neutral, fiber of each of the bi-material layers. Responsivity increases with decreasing bi-material thickness. However, the mechanical resonant frequency of the absorber plate mass on the flexing bi-material support also decreases with bi-material thickness and stiffness.

In another embodiment of the invention, device 100 further includes biasing plate 30. In the embodiment shown in FIG. 1, biasing plate 30 is shown in superior relation to first biomorph material 24, although other arrangements are contemplated.

One embodiment incorporates a construction having an upper conductive element 32, a biasing plate 30 and a lower conductive element 34 and a support layer 26 between the second electrode 31 and the substrate 15. Biasing plate 30, in this embodiment, is supported by first biomorph material 24 with lower conductive element 34 there between. The biasing plate 30 is between upper conductive element 32 and lower conductive element 34, which apply an electric field to the material of biasing plate 30.

Biasing plate can be constructed from piezoelectric material, such as crystalline or ceramic material, that expands or contracts when subjected to an electric field. Examples of the piezoelectric material include, but are not limited to, lead zirconate titanate (PZT), lead lanthanum zirconate titanate (PLZT), lead magnesium niobate-lead zirconate titanate (PMN-PZT), lead zirconate niobate-lead zirconate titanate (PZN-PZT), aluminum nitride (AlN), and zinc oxide (ZnO).

A poling process can be used to polarize the piezoelectric material. During the poling process, the piezoelectric material is heated and a large uniform unidirectional electric field is applied to align the domain dipoles in the material. The large uniform unidirectional electric field is removed after the piezoelectric material is cooled. In an alternative embodiment, the piezoelectric material is cooled after the large uniform unidirectional electric field is removed. In one embodiment, biasing plate 30 is poled by voltage applied to at least one of upper and lower biasing plate conductors 32 and 34.

When a voltage is applied to upper biasing plate conductor 32, and lower biasing plate 34 is grounded, an electric field is established in biasing plate 30. Voltage is applied to upper biasing plate conductor 32 through first spacer conductor 15a. Voltage is applied to lower biasing plate conductor 34 through second spacer conductor 15b. Both conductors extend through substrate 12 to provide electrical communication with a power source. Second spacer conductor 15b is also in electrical communication with arm conductor 25.

When biasing plate 30 is poled in the same direction as the electric field, biasing plate 30 expands under tensile stress. The expansion of biasing plate causes biomorph arm 10 to bend towards substrate 12 into gap 14. Contact of tip 20 with contact plate 13 is detected by the closing of the circuit resulting in the electrical connection of contact plate lead 13a and second spacer conductor 15b.

Figure 2:
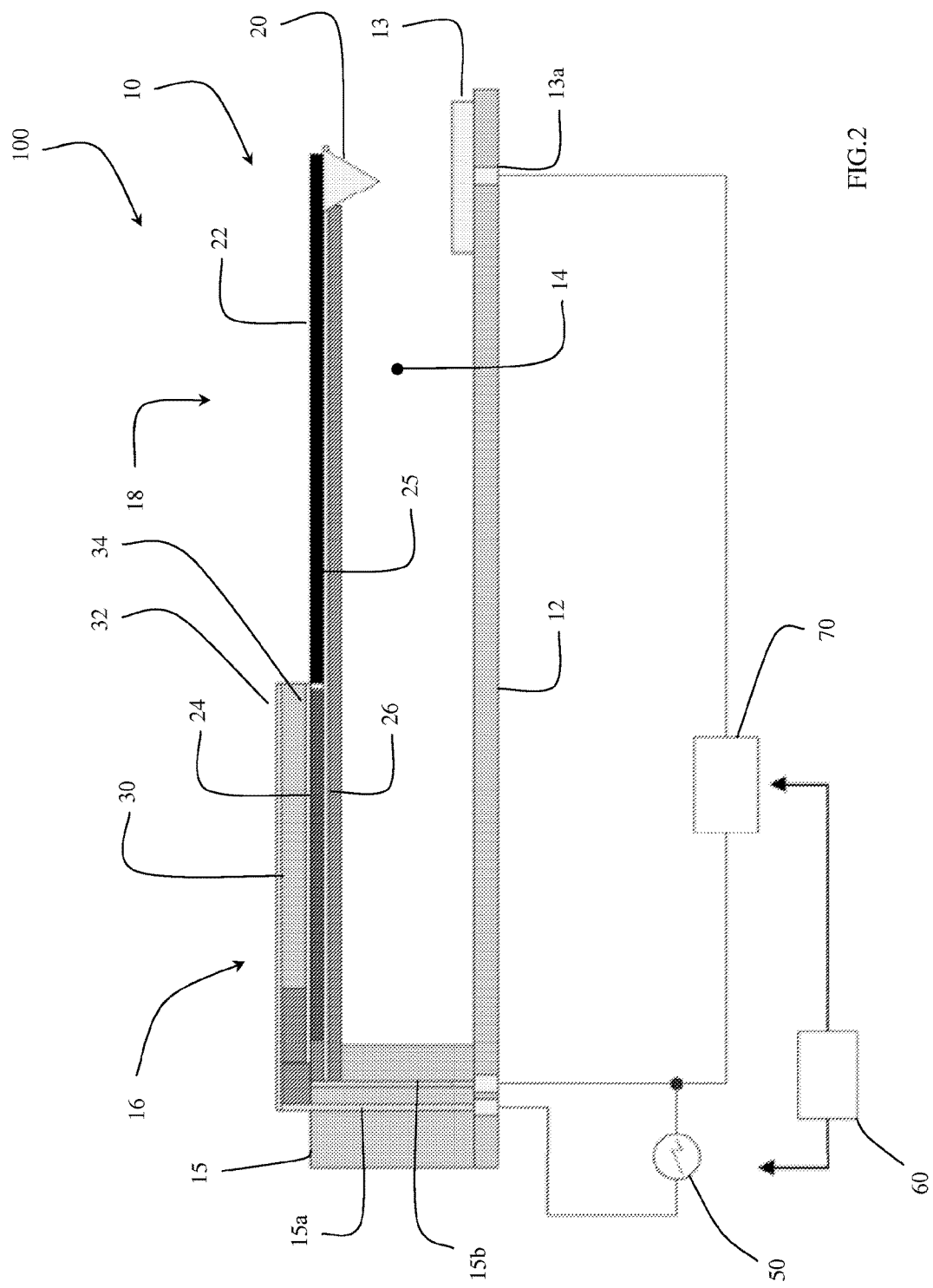
FIG. 2 is cross sectional view showing an illustrative embodiment of inventive detector and associated electronics.

Referring now to FIG. 2, voltage applied to upper biasing plate conductor 32 is supplied by power source 50, such as a linear ramp voltage generator, through first spacer conductor 15a. Power source 50 is communicatively coupled to digital clock counter 60. Counter 60 is initiated when power source 50 begins voltage generation. Counter 60 stops responsive to a signal from time register circuit 70. Time register circuit 70 is communicatively coupled to contact plate lead 13a. When tip 20 engages contact plate 13, thereby closing the circuit, the contact is detected by time register circuit 70 and the termination signal is sent to counter 60. The time count accumulated in counter 60 is loaded into a register with time register circuit 70.

In this configuration, the biasing plate 30 can optionally deflect bimorph arm 10 in the absence of infrared radiation to achieve a desired level of deflection. As incident radiation increases, the amount of deflection as a result of the expansion of biasing plate 30 is decreased to maintain the device of the desired level of deflection.

When used in conjunction with first embodiment, discussed above; the absorption of radiant energy by absorber material 22 causes a temperature increase in first and second biomorph materials (24, 26). The differential properties of the materials causes arm 10 to deflect at a rate faster than if arm 10 was deflected by biasing plate 30 alone. This results in a lower accumulated time count.

The accumulated time count can constitute a part or all of an output signal of the device. This signal may be used to provide a visible image which has an intensity based upon, at least partially, the duration of the accumulated time count. Conventional methods may be used.

As discussed, other embodiments employing a biasing plate are contemplated. Rather than being constructed from a piezoelectric material, for example, biasing plate 30 may be a heat generating element that heats up in response to a supplied current. Conventional methods may be used to form and pattern the heat generating element and to couple the heat generating element to the power source by means of conductors 15a and 15b. When an input current is supplied to the heat generating element the heat generating element heats up. Biasing plate 30 is in thermal contact with first bimorph material 24 within bi-material region 16. As such, bimorph arm 10 deflects downward responsive to the heat supplied by biasing plate 30 through first bimorph material 24.

In this configuration, the biasing plate 30 heats first bimorph material 24 in the absence of infrared radiation to achieve a desired level of deflection. As incident radiation increases, the amount of heat provided by biasing plate 30 is decreased to maintain the device of the desired level of deflection.

As discussed above, another embodiment of the invention includes a means of returning bimorph arm 10 to a neutral positon. The deflectable micro-cantilever, according to this embodiment, bends away from the substrate in response to an applied upward bias from biasing plate underlying the micro-cantilever.

Figure 3:
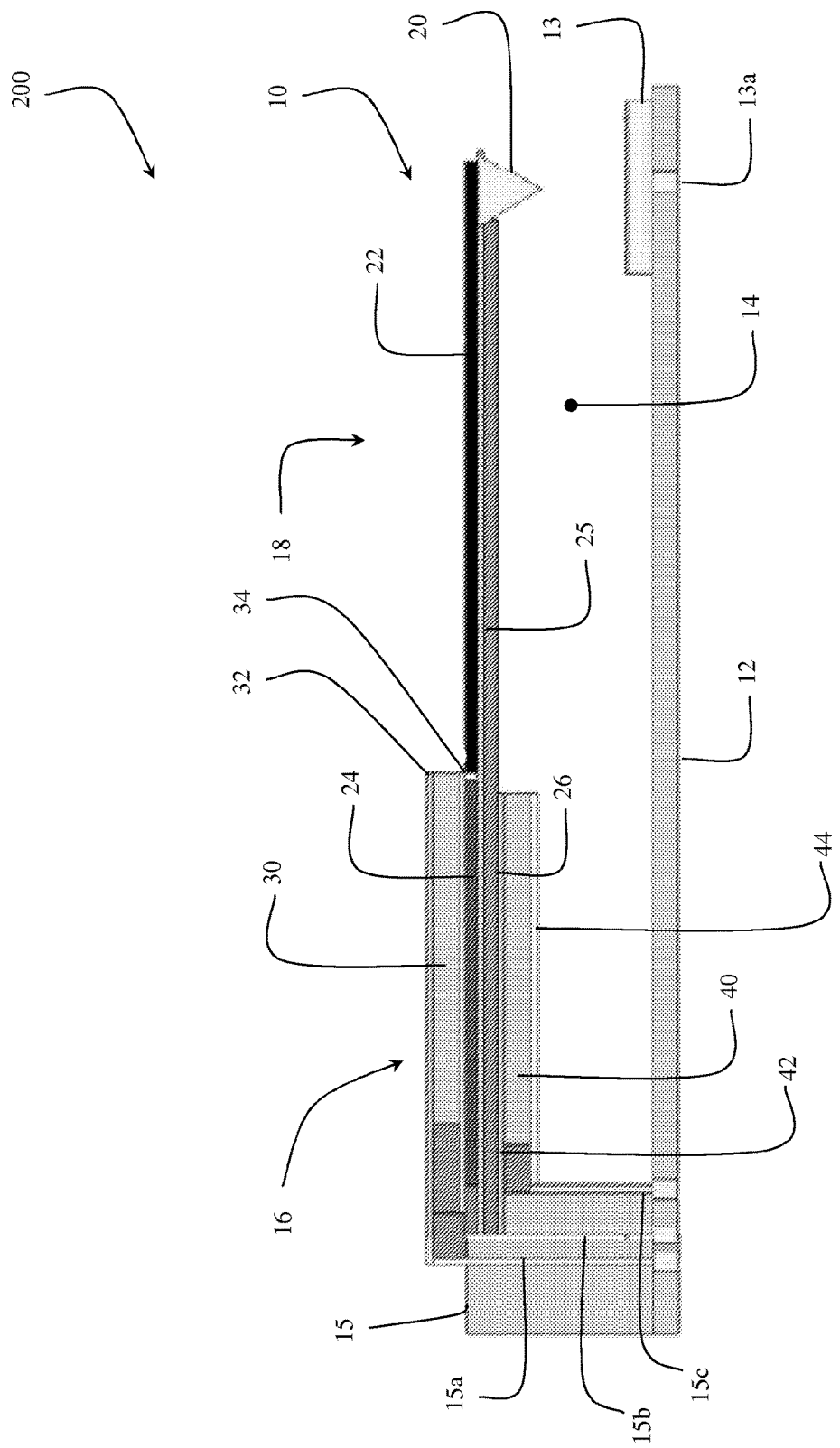
FIG. 3 is a cross sectional view showing an illustrative embodiment of inventive detector having at least two biasing mechanisms.
Figure 4:
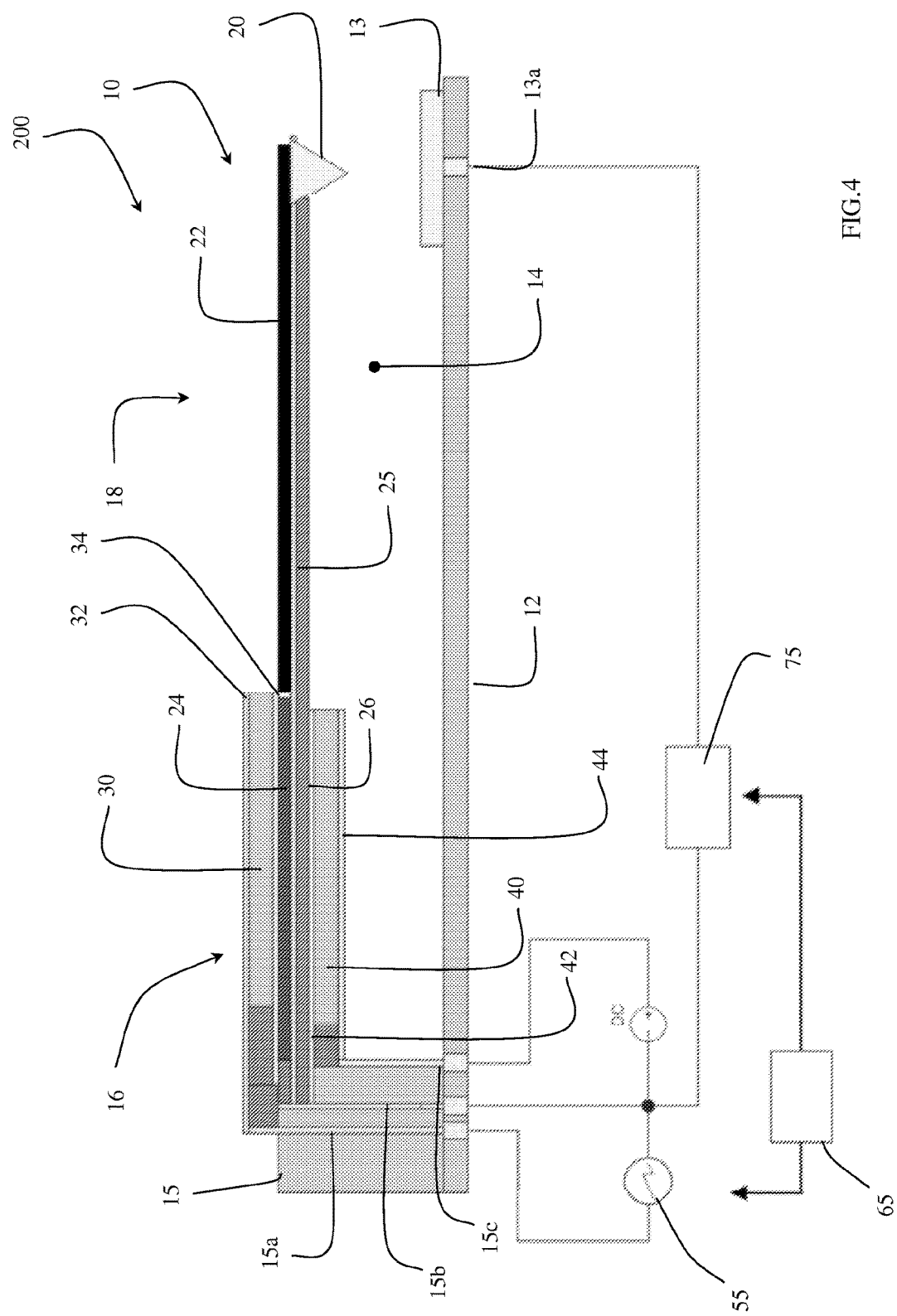
FIG. 4 is cross sectional view showing an illustrative embodiment of inventive detector having at least two biasing mechanisms and associated electronics.

As shown in FIG. 3, this embodiment is similar to the embodiments depicted in FIGS. 1 and 3. FIG. 3 is a cross sectional view showing an alternate embodiment of inventive detector 200. As shown, detector 200 includes biomorph arm 10 suspended over substrate 12. Gap 14 forms the opening between substrate 12 and biomorph arm 10 and is defined by the height of spacer 15. Substrate 12 includes contact plate 13 and contact plate lead 13a.

Biomorph arm 10 includes bi-material region 16 and absorbing region 18. Within absorbing region 18, absorber material 22 absorbs radiation which is incident on biomorph arm 10. In bi-material region 16, first bi-material film 24 and second bi-material 26 are present. First bi-material film 24 and absorber material 22 are contiguous and disposed in overlying relation to second bi-material film 26.

Contact tip 20 is adjacent the end of biomorph arm 10. Tip 20 and is preferably contiguous with second bi-material material 26 and in underlying relation to first biomorph material 24. Arm conductor 25 provides electrical communication between tip 20 and the conductive elements of spacer 15 (discussed below). Arm conductor 25 is preferably disposed in overlying relation to second bimorph material 26 and underlying relation to first bimorph material 24 and absorber material 22. Contact plate 13 and contact plate lead 13a electrically couple the device to other circuitry and devices (discussed below) when an electrical circuit is closed by the contact of tip 20 with plate 13.

First bi-material film 24 and second bi-material film 26 have different coefficients of thermal expansion. When radiation is incident upon the MEM structure, biomorph arm 10 is heated and bends because the two bi-material films 24 and 26 expand at different rates. FIG. 3 shows biomorph arm 10 in an original position when the device is not exposed to radiation.

As with previous embodiments, device 200 further includes first biasing plate 30. In the embodiment shown in FIG. 3, first biasing plate 30 is shown in superior relation to first biomorph material 24 and second biasing plate 40 is shown in inferior relation to second biomorph material 26, although other arrangements are contemplated.

As before, this embodiment incorporates a construction having an upper conductive element 32, a first biasing plate 30 and a lower conductive element 34. Biasing plate 30, in this embodiment, is supported by first bimorph material 24 with lower conductive element 34 there between. First biasing plate 30 is between upper conductive element 32 and lower conductive element 34, which apply an electric field to the material of first biasing plate 30.

The voltage applied to the conductors is generated by voltage generator 55 that is controlled by digital register 65 in electrical communication therewith. As voltage generator 55 is stepped upward in voltage by digital register 65 bimorph arm 10 is caused through piezo action to bend downward such that tip 20 contacts contact plate 13. When tip 20 contacts plate 13, the contact is detected by current voltage register circuit 75 and the current voltage level is loaded into a register within the current voltage register circuit 75. In this configuration, the biasing plate 30 can optionally deflect bimorph arm 10 in the absence of infrared radiation to achieve a desired level of deflection. As incident radiation increases, the amount of deflection as a result of the expansion of biasing plate 30 is decreased to maintain the device of the desired level of deflection.

When radiant energy is also absorbed absorber 22, the temperature of first and second bimorph materials (24, 26) increases. The bimorph action causes tip 20 to move downward toward contact plate 13.This increase in bending causes tip 13 to contact plate 13 at a lower applied piezo voltage.

Device 200 further includes second biasing plate an upper conductive element 42, second biasing plate 40 and a lower conductive element 44. Biasing plate 40, in this embodiment, is positioned in superior relation to second bimorph material 26 with upper conductive element 42 there between. Second biasing plate 40 is between upper conductive element 42 and lower conductive element 44, which apply an electric field to the material of second biasing plate 40. Second biasing plate 40 is poled by voltage applied to at least one of upper and lower biasing plate conductors 42 and 44.

When a fixed voltage is applied to upper biasing plate conductor 42, and lower biasing plate 44 is grounded, an electric field is established in second biasing plate 40. Voltage is applied to upper biasing plate conductor 42 through second spacer conductor 15b. Voltage is applied to lower biasing plate conductor 44 through third spacer conductor 15c. Both conductors extend through substrate 12 to provide electrical communication with power source 50. Second spacer conductor 15b is in electrical communication with arm conductor 25 as in the previous embodiments.

When second biasing plate 40 is poled in the same direction as the electric field, second biasing plate 40 expands under tensile stress. The expansion of biasing plate causes biomorph arm 10 to bend upward and away from substrate 12. The upward movement of biomorph arm 10 causes tip 20 to lose contact with contact plate 13 and thereby open the circuit. The result is that the arm bends upward thus increasing the amount of piezo voltage on first biasing plate 30 or the amount of energy absorbed by absorber 22 that is required to achieve contact between tip 20 and contact plate 13. In this way the dynamic range of the device can be modified.

Rather than being constructed from a piezoelectric material, second biasing plate 40 may also be a heat generating element that heats up in response to a supplied current. Conventional methods may be used to form and pattern the heat generating element and to couple the heat generating element to the power source by means of conductors 15b and 15c. When an input current is supplied to the heat generating element the heat generating element heats up. Second biasing plate 40 is in thermal contact with second bimorph material 26 within bi-material region 16. As such, bimorph arm 10 deflects upward responsive to the heat supplied by second biasing plate 40 through second bimorph material 26.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense. Any materials, which may be cited above, are fully incorporated herein by reference.

It is also to be understood that the following claims are intended to cover all of the generic and specific features of the invention herein described, and all statements of the scope of the invention which, as a matter of language, might be said to fall there between. Relative terminology, such as "substantially" or "about," describe the specified materials, steps, parameters or ranges as well as those that do not materially affect the basic and novel characteristics of the claimed inventions as whole (as would be appreciated by one of ordinary skill in the art). Now that the invention has been described,

What is claimed is:

1. An apparatus, comprising: (a) a deflectable bi-material micro-cantilever, said micro-cantilever being deflectable in response to each of incident infrared radiation and a further stimulus, and having a reference position relative to the substrate when not exposed to said infrared radiation and said further stimulus; (b) a biasing mechanism to apply said further stimulus operatively coupled to the micro-cantilever, said biasing mechanism comprising a first and second conductive element with a piezoelectric element disposed there between; (c) a contact tip disposed adjacent one end of the micro-cantilever and in electrical communication with a power source; (d) a contact plate positioned on the substrate beneath the contact tip with a predetermined space there between with the micro-cantilever is in the reference position; and (e) a spacer between the micro-cantilever and the substrate; (f) wherein the piezoelectric element expands when a current is applied to at least one of the first and second conductive elements, said expansion causing deflection of the micro-cantilever such that the contact tip comes into contact with the contact plate thereby closing a circuit.

2. The apparatus of claim 1, wherein the micro-cantilever is attached to the spacer at an end opposite the contact tip.

3. The apparatus of claim 2, wherein the micro-cantilever further comprises:
   (a) a lower layer formed from a first bimorph material;
   (b) an upper layer adjacent the spacer and formed from a second bimorph material;
   (c) an absorption layer adjacent the upper layer and extending to the end of the micro-cantilever; and
   (d) a conductive element, in electrical contact with the contact tip at one end, disposed between the lower layer and the upper and absorption layers.

4. The apparatus of claim 3 wherein the biasing mechanism is in superior relation to the second bimorph material.

5. The apparatus of claim 1, wherein the first conductive element of the biasing mechanism is communicatively coupled with a power source through a first conductive element in the spacer and the second conductive element of the biasing mechanism is communicatively coupled with a power source through a second conductive element in the spacer.

6. The apparatus of claim 5 wherein the micro-cantilever further comprises:
   (a) a lower layer formed from a first bimorph material;
   (b) an upper layer adjacent the spacer and formed from a second bimorph material;
   (c) an absorption layer adjacent the upper layer and extending to the end of the micro-cantilever; and
   (d) a conductive element, in electrical contact with the contact tip at one end, disposed between the lower layer and the upper and absorption layers;
   (e) wherein the longitudinal conductive element is in electrical communication with the second conductive element in the spacer.

7. The apparatus of claim 5 wherein a voltage applied from the power source applies a voltage potential to the first conductive element of the biasing element through the first conductive element of the spacer.

8. The apparatus of claim 5 wherein the power source is communicatively coupled to a timing element and a time register circuit, wherein the timing element is started when a current is generated by the power source.

9. The apparatus of claim 8 wherein contact of the contact tip with the contact plate establishes a closed circuit with the second conductive element of the spacer and wherein the closing of the circuit is detected by the time register circuit and stops the timing element.

10. An apparatus, comprising:
    (a) a deflectable bi-material micro-cantilever, said micro-cantilever being deflectable in response to each of an incident infrared radiation and a further stimulus, and having a reference position relative to the substrate when not exposed to said infrared radiation and said further stimulus;
    (b) a spacer between the micro-cantilever and the substrate;
    (c) a contact tip disposed adjacent one end of the micro-cantilever and in electrical communication with a power source;
    (d) contact plate positioned on the substrate beneath the contact tip with a predetermined space there between with the micro-cantilever is in the reference position;
    (e) a first biasing mechanism to apply said further stimulus operatively coupled to the micro-cantilever, said biasing mechanism comprising a first and second conductive element with a piezoelectric element disposed there between; and
    (f) second biasing mechanism to apply a second further stimulus operatively coupled to the micro-cantilever, said biasing mechanism comprising a first and second conductive element with a piezoelectric element disposed there between;
    (g) wherein the piezoelectric element expands when a current is applied to at least one of the first and second conductive elements of the first biasing mechanism, said expansion causing deflection of the micro-cantilever such that the contact tip comes into contact with the contact plate thereby closing a circuit.

11. The apparatus of claim 10, wherein the micro-cantilever is attached to the spacer at an end opposite the contact tip and wherein the micro-cantilever further comprises:
    (a) a lower layer formed from a first bimorph material;
    (b) an upper layer adjacent the spacer and formed from a second bimorph material;
    (c) an absorption layer adjacent the upper layer and extending to the end of the micro-cantilever; and
    (d) a longitudinal conductive element, in electrical contact with the contact tip at one end, disposed between the lower layer and the upper and absorption layers.

12. The apparatus of claim 11,
    (a) wherein the first conductive element of the first biasing mechanism is communicatively coupled with a power source through a first conductive element in the spacer and the second conductive element of the first biasing mechanism is communicatively coupled with a power source through a second conductive element in the spacer; and
    (b) wherein the first conductive element of the second biasing mechanism is communicatively coupled with a power source through the second conductive element in the spacer and the second conductive element of the second biasing mechanism is communicatively coupled with a power source through a third conductive element in the spacer.

13. The apparatus of claim 12 wherein the micro-cantilever further comprises:
    (a) a lower layer formed from a first bimorph material;
    (b) an upper layer adjacent the spacer and formed from a second bimorph material;
    (c) an absorption layer adjacent the upper layer and extending to the end of the micro-cantilever; and
    (d) a conductive element, in electrical contact with the contact tip at one end, disposed between the lower layer and the upper and absorption layers;
    (e) wherein the longitudinal conductive element is in electrical communication with the second conductive element in the spacer.

14. The apparatus of claim 13 wherein the first biasing mechanism is in superior relation to the second bimorph material and the second biasing mechanism is in inferior relation to the first bimorph material.

15. The apparatus of claim 13 wherein a voltage applied from the power source applies a voltage potential to the first conductive element of the biasing element through the first conductive element of the spacer.

16. The apparatus of claim 13 wherein a voltage applied from the power source applies a voltage potential to the second conductive element of the second biasing mechanism through the third conductive element of the spacer.

17. The apparatus of claim 13 wherein the power source is communicatively coupled to a digital voltage register and a voltage register circuit.

18. The apparatus of claim 17 wherein contact of the contact tip with the contact plate establishes a closed circuit with the second conductive element of the spacer.

* * * * *